(12) United States Patent
Kim

(10) Patent No.: US 7,573,082 B2
(45) Date of Patent: Aug. 11, 2009

(54) CMOS IMAGE SENSOR AND METHOD OF FABRICATING THE SAME

(75) Inventor: Hyung Sik Kim, Cheongju (KR)

(73) Assignee: MagnaChip Semiconductor Ltd., Chungcheongbuk-do (KR)

( * ) Notice: Subject to any disclaimer, the term of this patent is extended or adjusted under 35 U.S.C. 154(b) by 214 days.

(21) Appl. No.: 11/491,236

(22) Filed: Jul. 24, 2006

(65) Prior Publication Data

US 2007/0023764 A1    Feb. 1, 2007

(30) Foreign Application Priority Data

Jul. 25, 2005    (KR) ...................... 10-2005-0067166

(51) Int. Cl.
*H01L 31/062* (2006.01)

(52) U.S. Cl. ............... 257/292; 257/291; 257/E27.131; 257/E27.133

(58) Field of Classification Search ......... 257/290–292, 257/431, 461, 462; 438/60, 75, 144–145, 438/149, 151, 152
See application file for complete search history.

(56) References Cited

U.S. PATENT DOCUMENTS

| | | | |
|---|---|---|---|
| 2005/0012124 A1* | 1/2005 | Rhodes | 257/291 |
| 2005/0032281 A1* | 2/2005 | McClure | 438/144 |
| 2005/0077554 A1* | 4/2005 | Rhodes | 257/291 |
| 2006/0273354 A1* | 12/2006 | Choi et al. | 257/239 |
| 2006/0273355 A1* | 12/2006 | Han | 257/239 |
| 2007/0085119 A1* | 4/2007 | Jeon | 257/292 |

FOREIGN PATENT DOCUMENTS

| | | |
|---|---|---|
| JP | 2001-210815 | 3/2001 |
| JP | 2002-118249 | 4/2002 |

* cited by examiner

*Primary Examiner*—Ha Tran T Nguyen
*Assistant Examiner*—Daniel Whalen
(74) *Attorney, Agent, or Firm*—Morgan Lewis & Bockius LLP

(57) ABSTRACT

A CMOS image sensor and a method of fabricating the same are provided. In the CMOS image sensor, a device isolation layer is formed in a substrate to define an active region, and a photodiode is formed in the active region. A floating diffusion region is formed at a position spaced apart from the photodiode, and first and second gates are overlapped with one end of the photodiode and one end of the floating diffusion region, respectively. A third gate is disposed between the first gate and the second gate and overlapped with an upper portion of the device isolation layer and a predetermined portion of the floating diffusion region. An insulating layer is formed on the resulting structure where the third gate is formed. A buried contact has a first contact and a second contact, which are sequentially stacked to pass through the insulating layer and the third gate and to connect the third gate to the floating diffusion region disposed under the third gate.

8 Claims, 6 Drawing Sheets

[FIG. 1]
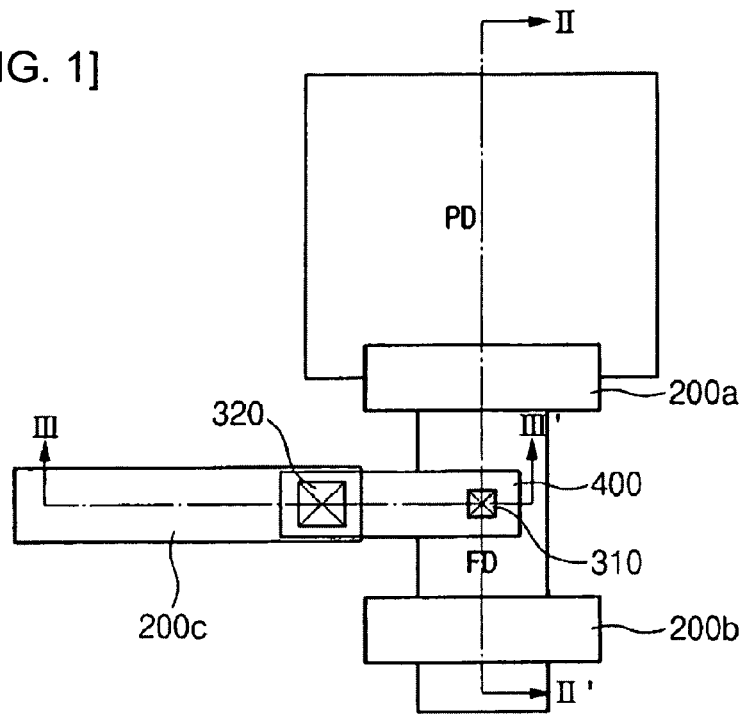
[FIG. 2]
-Prior Art-
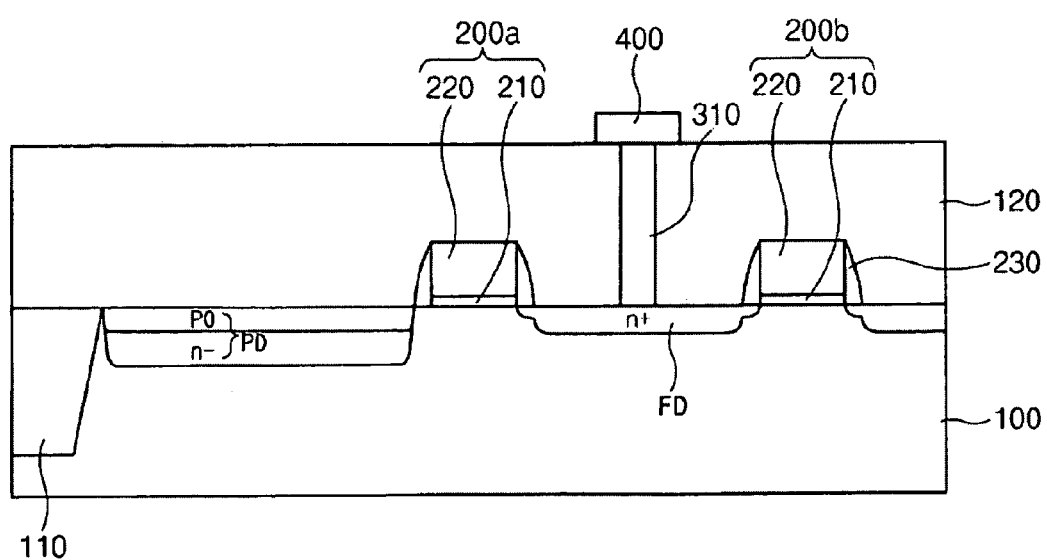

[FIG. 3]
-Prior Art-
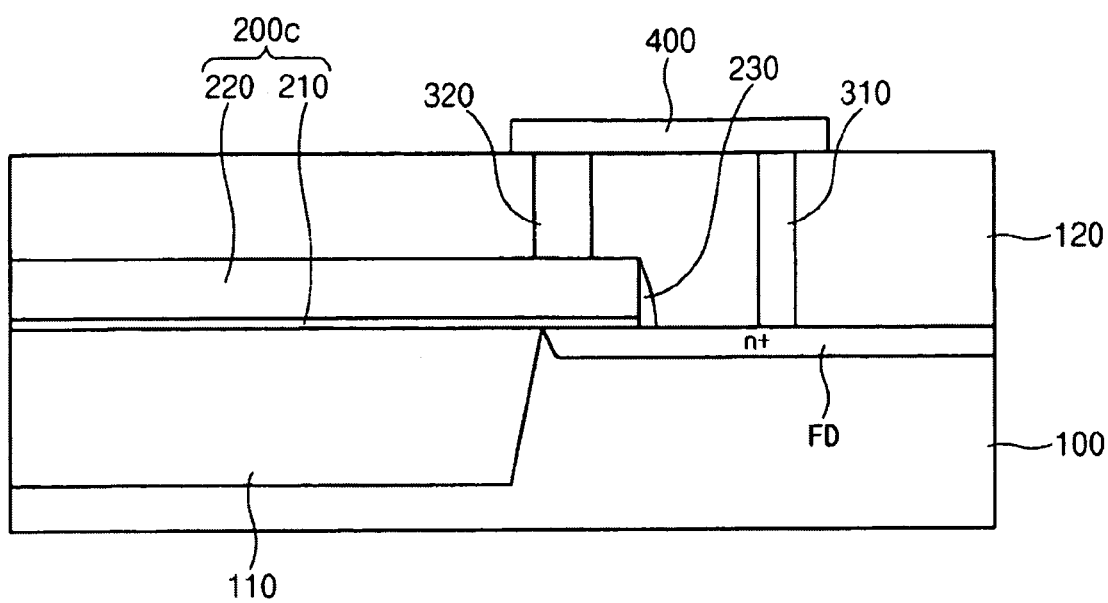
[FIG. 4]
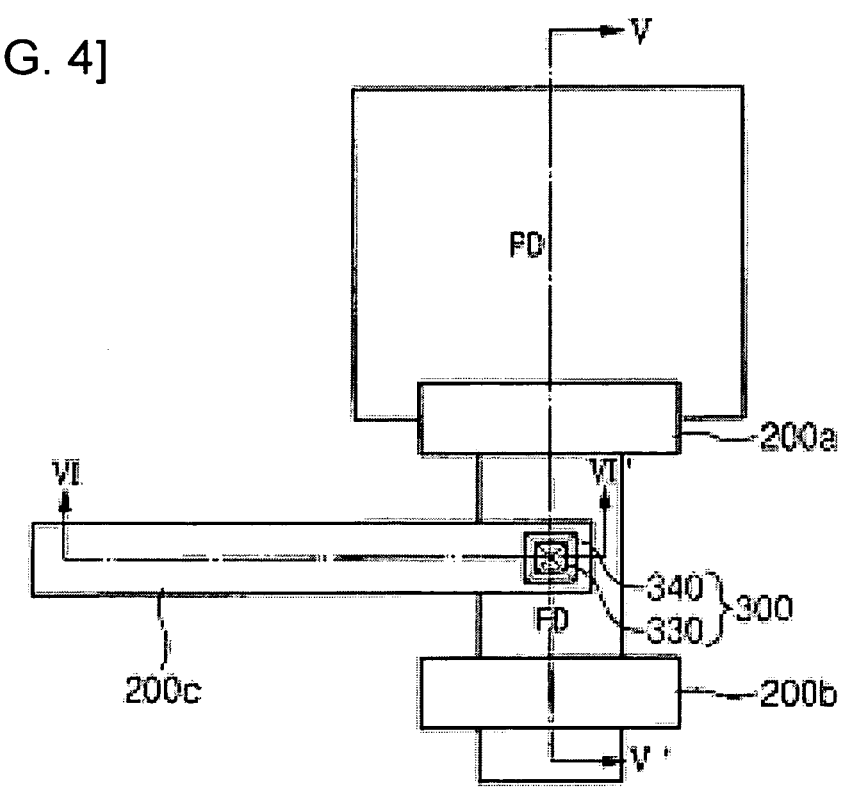

[FIG. 5]
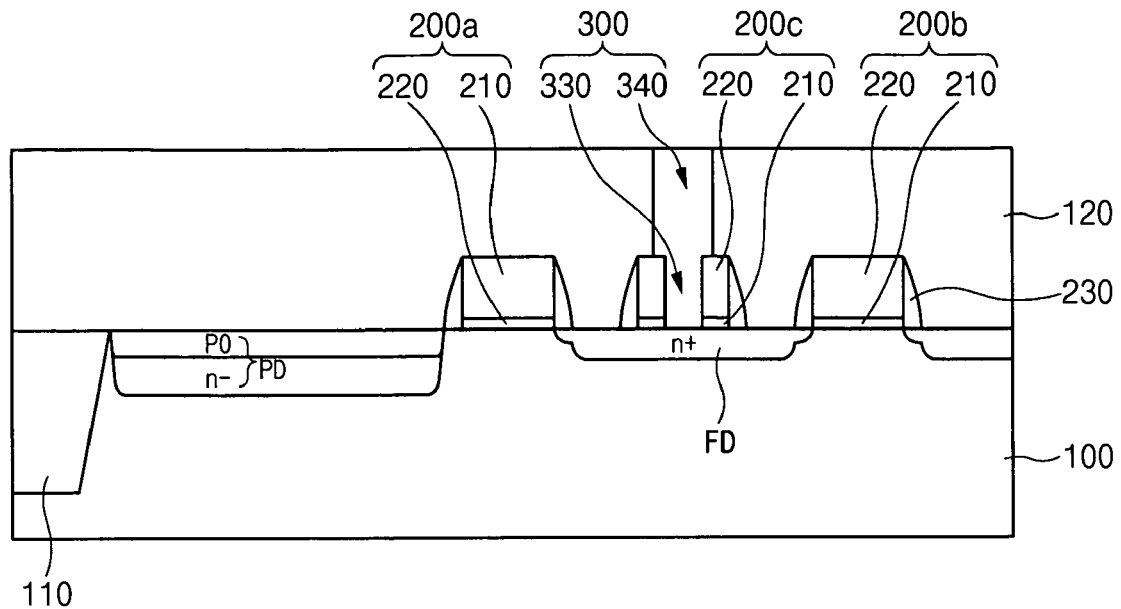
[FIG. 6]
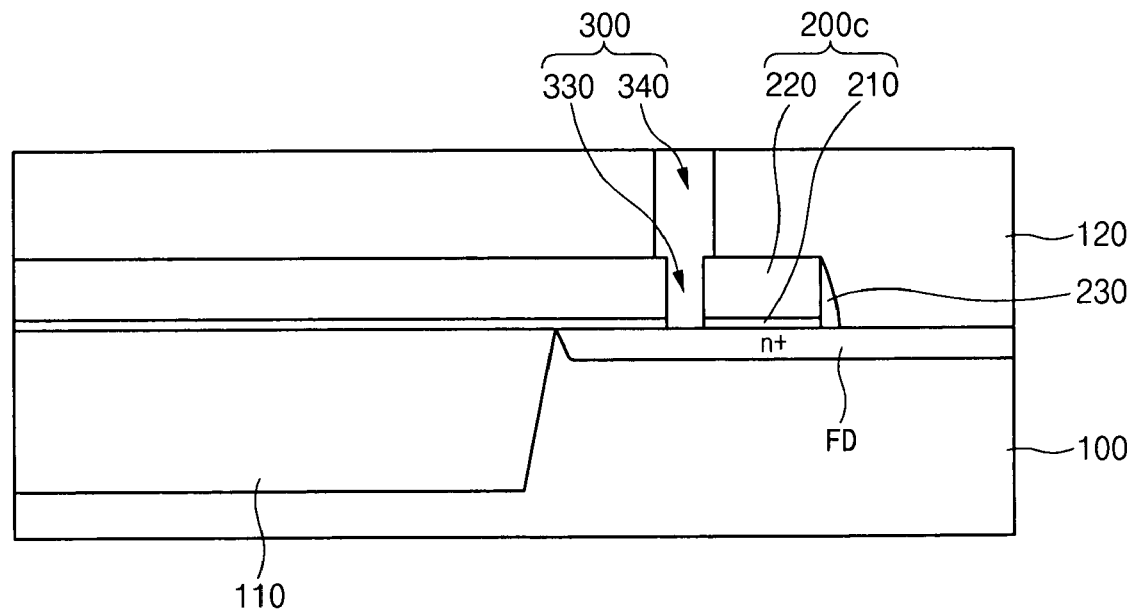
[FIG. 7A]
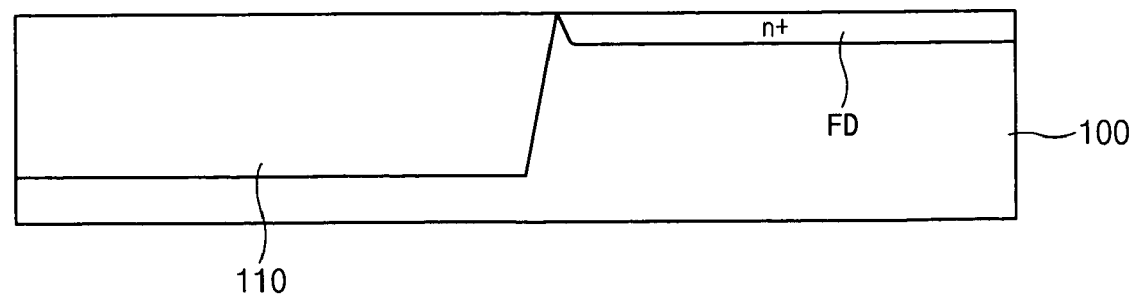

[FIG. 7B]
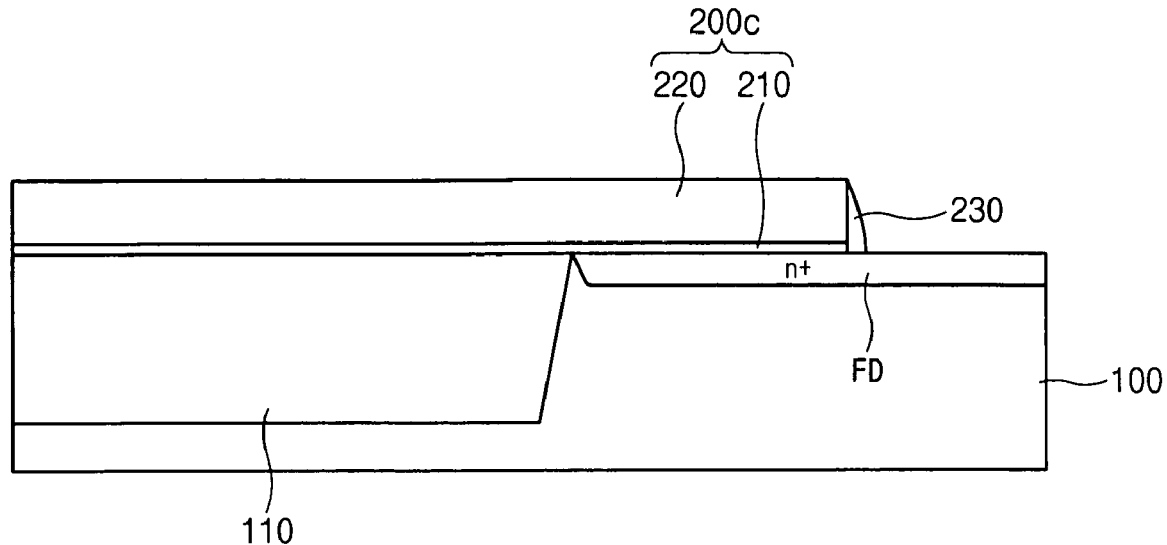
[FIG. 7C]
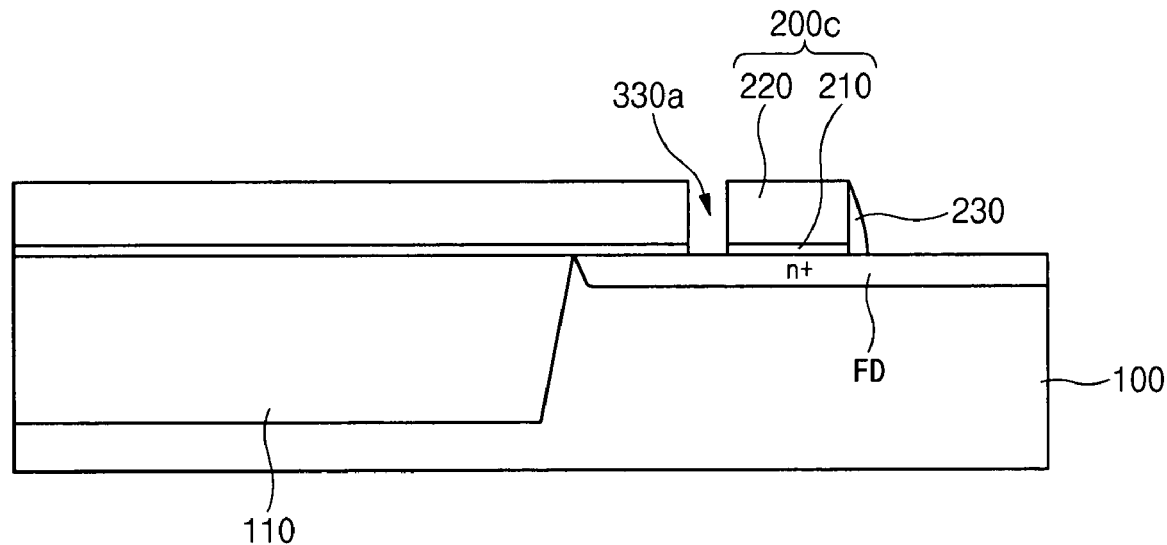

[FIG. 7D]
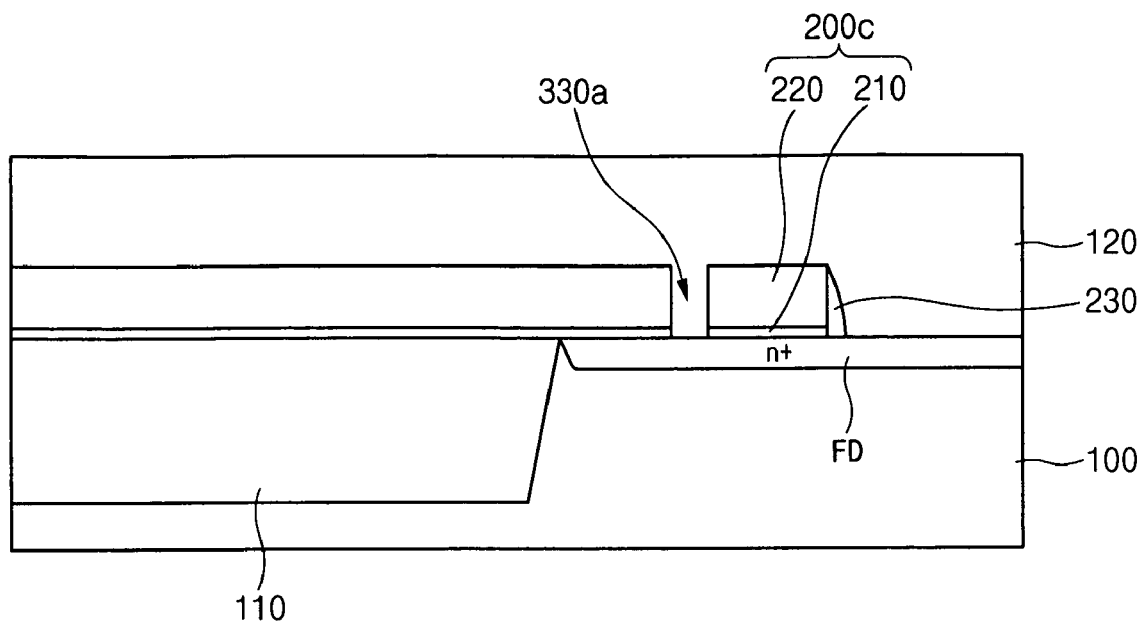
[FIG. 7E]
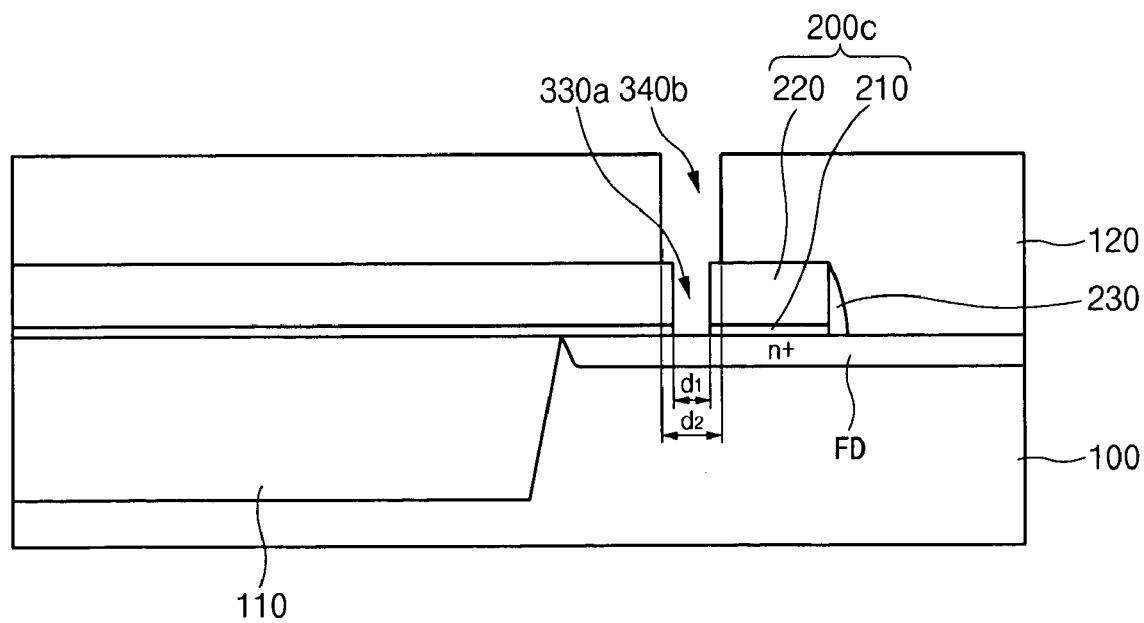

[FIG. 8]
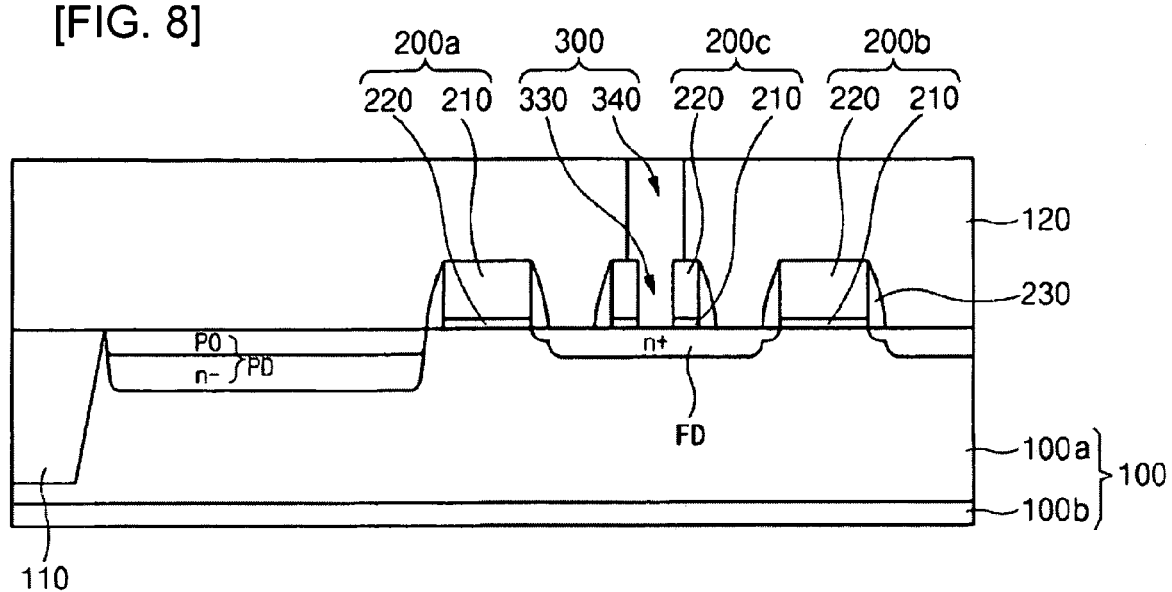
[FIG. 9]
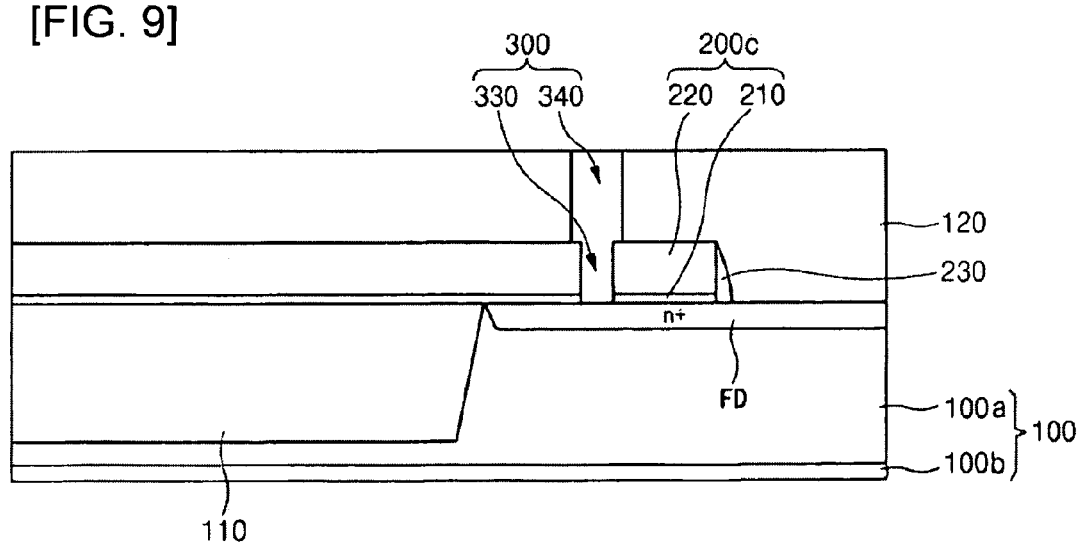

CMOS IMAGE SENSOR AND METHOD OF FABRICATING THE SAME

CROSS-REFERENCE TO RELATED APPLICATIONS

This application claims the benefit of Korean Patent Application No. 2005-0067166 filed with the Korean Industrial Property Office on Jul. 25, 2005, the disclosure of which is incorporated herein by reference.

BACKGROUND OF THE INVENTION

1. Field of the Invention

The present invention relates to a CMOS image sensor and a method of fabricating the same, which can reduce an area of a contact region so that the CMOS image sensor is highly integrated.

2. Description of the Related Art

Generally, an image sensor is a semiconductor device to convert an optical image into electric signal. A charge coupled device (CCD) includes metal-oxide-silicon (MOS) capacitors located at very close positions, and stores and transfers charge carriers to the MOS capacitors. On the other hand, a complementary MOS (CMOS) image sensor includes a control circuit and a signal processing circuit as a peripheral circuit. In the CMOS image sensor, MOS transistors are formed as many as pixels by using CMOS technology. The CMOS image sensor sequentially detects output data through the switching operations of the MOS transistors.

In fabricating various kinds of image sensors, many attempts to increase photosensitivity have been made. One of them is a light concentrating technology. Because the CMOS image sensor includes a photodiode for detecting light and a CMOS logic circuit part for processing the detected light to output an electric signal, the photodiode is formed to occupy much area in the entire area of the CMOS image sensor so as to increase photosensitivity.

A CMOS image sensor according to the related art will be described below with reference to FIGS. 1 to 3.

FIG. 1 is a plan view of the CMOS image sensor according to the related art, FIG. 2 is a sectional view taken along line II-II' of FIG. 1, and FIG. 3 is a sectional view taken along III-III' of FIG. 1.

Referring to FIG. 1, a photodiode (hereinafter, referred to as a PD) is formed in a substrate (not shown), and a floating diffusion (hereinafter, referred to as an FD) region is formed at a position spaced apart from the PD. A first gate 200a overlaps one end of the PD, and a second gate 200b overlaps one end of the FD region. The first gate 200a and the second gate 200b transfer an optical signal from the PD to the FD region by on-off operations. A third gate 200c is connected to the FD region and acts as a source follower buffer amplifier. For example, the first gate 200a is a transfer gate and the second gate 200b is a reset gate, and the third gate 200c is a drive gate and a line connected to a source or drain of a reset transistor. Although not shown in FIG. 1, the CMOS image sensor further includes a fourth gate, that is, a select gate, which can perform addressing through a switching operation.

In addition, the CMOS image sensor according to the related art includes a first contact 310 and a second contact 320. The first contact 310 and the second contact 320 are connected to the FD region and the third gate 200c, respectively. Furthermore, the first contact 310 and the second contact 320 are connected to each other through a metallic wiring line 400, so that the third gate 200c and the FD region are connected to each other. FIG. 1 illustrates the state when the process of forming the first contact 310 and the second contact 320 is completed so as to connect the FD region to the third gate 200c. The FD region is a highly doped n-type (n+) and is formed through an ion implantation process for the formation of the PD.

Referring to FIGS. 2 and 3, a device isolation layer 110 is locally formed on the substrate 100, and the PD is formed in a predetermined portion of the substrate 100 adjacent to the device isolation layer 110 through an ion implantation process. The substrate 100 is formed using a semiconductor layer. For simplicity of the drawings, such a substrate is referred to as the substrate 100. In addition, an n-type photodiode region (hereinafter, referred to as an n-region) is formed in a lower portion of the p-type substrate, and a p-type photodiode region (hereinafter, referred to as P0) is extended from a surface of the substrate 100 toward the n-region.

The first gate 200a and the second gate 200b have a stacked structure of a gate dielectric layer 210 and a gate electrode 220 on the substrate 100. The first gate 200a and the second gate 200b are formed to overlap one end of the PD and one end of the FD region, respectively. The third gate 200c is formed on the device isolation layer 110 adjacent to the FD region. The third gate 200c has a stacked structure of the gate dielectric layer 210 and the gate electrode 220. Spacers 230 are formed of an insulating layer on sidewalls of the first, second and third gates 200a, 200b and 200c. The gate electrode 220 may have a single layer structure of polysilicon layer, or a multi-layer structure where polysilicon layer and tungsten layer are sequentially stacked.

An insulating layer 120 is formed on the resulting structure where the third gate 200c and the FD region are formed. The first contact 310 and the second contact 320, passing through the insulating layer 120, are connected to an upper surface of the gate electrode 220 of the third gate 200c and an upper surface of the FD region, respectively. The first contact 310 and the second contact 320 are connected through the metallic wiring line 400 formed on the insulating layer 120. That is, the third gate 200c and the FD region are electrically connected by the metallic wiring line 400 connecting the first contact 310 to the second contact 320. The third gate 200c can receive the optical signal of the FD region, which is transferred from the PD, and amplifies the received optical signal through the third gate 200c.

In the CMOS image sensor according to the related art, the PD region can be defined after the first contact region, the second contact region, and the metal line region are secured in the CMOS logic circuit part, in order to electrically connect the FD region and the third gate.

In order to increase photosensitivity, an area ratio of the PD, not the CMOS logic circuit part, has to be large in the entire area of the CMOS image sensor. Therefore, there is a limitation in reducing an entire size of the image sensor. Consequently, there is a limitation in improving the photosensitivity.

SUMMARY OF THE INVENTION

An advantage of the present invention is that it provides a CMOS image sensor, which can be highly integrated by minimizing an area of a contact region in a CMOS logic circuit part that processes light detected by a photodiode into an electric signal.

In addition, the present invention provides a method of fabricating the CMOS image sensor.

Additional aspect and advantages of the present general inventive concept will be set forth in the description which follows and, in part, will be obvious from the description, or may be learned by practice of the general inventive concept.

According to an aspect of the invention, a CMOS image sensor includes: a device isolation layer formed in a substrate to define an active region; a photodiode formed in the active region; a floating diffusion region formed at a position spaced apart from the photodiode; first and second gates overlapped with one end of the photodiode and one end of the floating diffusion region, respectively; a third gate disposed between the first gate and the second gate and overlapped with an upper portion of the device isolation layer and a predetermined portion of the floating diffusion region; an insulating layer formed on the resulting structure where the third gate is formed; and a buried contact having a first contact and a second contact, the first contact and the second contact being sequentially stacked to pass through the insulating layer and the third gate and to connect the third gate to the floating diffusion region disposed under the third gate.

According to another aspect of the present invention, each of the first gate, the second gate, and the second gate has a stacked structure of a gate dielectric layer and a gate electrode. The gate electrode has a multi-layer structure in which a polysilicon layer and a metal layer are sequentially stacked.

According to a still further aspect of the present invention, the first gate, the second gate, and the third gate have spacers on sidewalls thereof. It is preferable that the first, second and third gates be protected from being shorted with adjacent electric lines.

According to a still further aspect of the present invention, a diameter of the second contact is greater than or equal to that of the first contact.

According to a still further aspect of the present invention, the buried contact is formed by wholly or partially overlapping the first contact with the second contact. When the first contact and the second contact are partially overlapped with each other, it is preferable that they be overlapped in a moving direction of electrons so that the electrons can move smoothly.

According to a still further aspect of the present invention, the substrate is formed using a semiconductor layer. More preferably, the semiconductor layer is formed by stacking a highly doped P++ layer and a P-epi layer in sequence.

According to a still further aspect of the present invention, a method of fabricating a CMOS image sensor includes: forming a device isolation layer in a substrate to define an active region; forming a photodiode and a floating diffusion region in the active region, the photodiode and the floating diffusion region being spaced apart from each other; forming a first gate and a second gate to overlap one end of the photodiode and one end of the floating diffusion region, and forming a third gate between the first gate and the second gate, the third gate being partially overlapped with an upper portion of the device isolation layer and a predetermined portion of the floating diffusion region; etching a predetermined portion of the third gate to form a first contact hole exposing an upper surface of the floating diffusion region; forming an insulating layer on the entire surface of a resulting structure where the first contact hole is formed; etching the insulating layer disposed at a position corresponding to the first contact hole to form a second contact exposing an upper surface of the floating diffusion region through the first contact hole; and filling the first contact hole and the second contact hole with metal to form a buried contact.

According to a still further aspect of the present invention, the method may further include forming spacers on sidewalls of the first gate, the second gate, and the third gate before forming the first contact hole. Alternatively, the method may further include forming spacers on sidewalls of the first gate, the second gate, and the third gate after forming the first contact hole.

According to a still further aspect of the present invention, the substrate is formed using a semiconductor layer. More preferably, the semiconductor layer is formed by stacking a highly doped P++ layer and a P-epi layer in sequence.

According to a still further aspect of the present invention, the method may further include performing an impurity ion implantation process on the exposed floating diffusion region after forming the first contact hole.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a plan view of a CMOS image sensor according to the related art;

FIG. 2 is a sectional view taken along line II-II' of FIG. 1;

FIG. 3 is a sectional view taken along line III-III' of FIG. 1;

FIG. 4 is a plan view of a CMOS image sensor according to an embodiment of the present invention;

FIG. 5 is a sectional view taken along line V-V' of FIG. 4;

FIG. 6 is a section view take along VI-VI' of FIG. 4; and

FIGS. 7A to 7E are sectional views illustrating a method of fabricating the CMOS image sensor according to an embodiment of the present invention;

FIG. 8 is a section view taken along line V-V' of FIG. 4; and

FIG. 9 is a section view taken along line VI-VI' of FIG. 4.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Hereinafter, a CMOS image sensor and a method of fabricating the same according to the present invention will be described in detail with reference to the accompanying drawings.

Structure of CMOS Image Sensor

A CMOS image sensor according to an embodiment of the present invention will be described below in detail with reference to FIGS. 4 to 6.

FIG. 4 is a plan view of a CMOS image sensor according to an embodiment of the present invention, FIG. 5 is a sectional view taken along line V-V' of FIG. 4, and FIG. 6 is a sectional view taken along VI-VI' of FIG. 4.

Referring to FIG. 4, a PD is formed in a substrate (not shown), and an FD region is formed at a position spaced apart from the PD. A first gate 200a and a second gate 200b overlap one end of the PD and one end of the FD region, respectively. The first gate 200a and the second gate 200b transfer an optical signal from the PD to the FD region by on-off operations. A third gate 200c is connected to the FD and acts as a source follower buffer amplifier.

Specifically, the third gate 200c is formed to partially overlap the FD region disposed between the first gate 200a and the second gate 200b. The third gate 200c and the FD region are directly connected to each other through a buried contact 300. The buried contact 300 includes a first contact 330 and a second contact 340. The first contact 330 passing through the third gate 200c is connected to the FD region, and the second contact 340 passes through an insluting layer (not shown) disposed on the first contact 330. It is preferable that a diameter of the second contact 340 be greater than or equal to that of the first contact 330.

The CMOS image sensor according to the present invention will be described in more detail with reference to FIGS. 5 and 6.

Referring to FIGS. 5 and 6, a device isolation layer 110 is locally formed in a substrate 100, and a PD is formed in a predetermined portion of the substrate 100 adjacent to the device isolation layer 110 through an ion implantation process. The substrate 100 is formed using a semiconductor layer, more preferably, a semiconductor layer where a highly doped P++ layer 100b and a P-epi 100a layer are stacked. (See FIGS. 8 and 9). For simplicity of the drawings, such a substrate is simply referred to as the substrate 100. In addition, an n-type photodiode region (hereinafter, referred to as an n-region) is formed in a lower portion of the p-type substrate, and a p-type photodiode region (hereinafter, referred to as P0) is extended from a surface of the substrate 100 toward the n-region.

The first gate 200a and the second gate 200b have a stacked structure of a gate dielectric layer 210 and a gate electrode 220 on the substrate 100. The first gate 200a and the second gate 200b are formed to overlap one end of the PD and one end of the FD region, respectively. The third gate 200c is formed on a predetermined upper portion of the FD region and the device isolation layer 110 adjacent to the FD region. The third gate 200c has a stacked structure of the gate dielectric layer 210 and the gate electrode 220. Spacers 230 are formed of an insulating layer on sidewalls of the first, second and third gates 200a, 200b and 200c. The gate electrode 220 may have a single layer structure of polysilicon layer, or a multi-layer structure where a polysilicon layer and a tungsten layer are sequentially stacked.

An insulating layer 120 is formed on the resulting structure where the third gate 200c and the FD region are formed.

The third gate 200c and the FD region are directly connected to each other through a buried contact 300. The buried contact 300 includes a first contact 330 and a second contact 340. The first contact 330 passes through the third gate 200c, and the second contact 340 passes through the insluting layer 120 corresponding to the first contact 330. It is preferable that a diameter of the second contact 340 be greater than or equal to that of the first contact 330. In addition, if only the third gate 200c and the FD region are directly connected to each other through the buried contact 300, the first contact 330 and the second 340 may be wholly or partially overlapped with each other. When the first contact 330 and the second contact 340 are partially overlapped, it is preferable that they be overlapped in a moving direction of electrons so that the electrons can move smoothly.

According to the present invention, the third gate 200c and the FD region are directly connected by the buried contact 300, which includes the first contact 330 that passes through the third gate 200c so as to be directly connected to the FD region, and the second contact 340 that passes through the insulating layer 120 corresponding to the first contact 330 so as to be connected to the first contact 330. While the conventional contacts indirectly connected to the third gate and the FD region are connected through the metallic wiring line, the third gate and the FD region according to the present invention are directly connected through the buried contact. Therefore, a space margin of the contact for connecting the third gate to the FD region is not needed.

According to the present invention, the CMOS logic circuit part for connecting the third gate to the FD region can be minimized in the entire area of the image sensor. Consequently, the photosensitivity can be improved by increasing the area ratio of the PD in the entire area of the image sensor. Moreover, the CMOS image sensor can be highly integrated.

Method of Fabricating CMOS Image Sensor

A method of fabricating the CMOS image sensor of FIG. 6 according to an embodiment of the present invention will be described below in detail with reference to FIGS. 7A to 7E.

FIGS. 7A to 7E are sectional views illustrating sequential procedures of fabricating the CMOS image sensor according to an embodiment of the present invention.

Referring to FIG. 7A, a device isolation layer 110 is locally formed in a substrate 100 to define a field region and an active region. The substrate 100 is formed using a semiconductor layer where a highly doped P++ layer 100b and a P-epi layer 100a are stacked. (See FIGS. 8 and 2).

Then, an ion implantation process is performed on the active region of the substrate 100 to form a PD (see FIG. 5) and an FD region spaced apart from the PD. The PD is formed of P(P-epi)-N(n-)-P(p0).

Referring to FIG. 7B, a third gate 200c is formed to overlap an upper portion of the device isolation layer 110 and a predetermined portion of the FD region. The third gate 200c has a stacked structure of a gate dielectric layer 210 and a gate electrode 220. Preferably, the gate electrode 220 has a multi-layer structure where a polysilicon layer and a metal layer are sequentially stacked. More specifically, the first gate (not shown) and the second gate (not shown) are formed to overlap one end of the PD and one end of the FD region, and the third gate 200c is formed between the first gate and the second gate.

A spacer 230 is formed of an insulating material on a sidewall of the third gate 200c. The spacer 230 may be formed after formation of a first contact hole, which will be described later, and may be optional according to process characteristic and process condition.

Referring to FIG. 7C, the third gate 200c is partially etched to form a first contact hole 330a exposing a predetermined upper surface of the FD region disposed under the third gate 200c.

An impurity implantation process is further performed on the FD region exposed by the first contact hole 330a. This process compensates for concentration of lost impurities in etching the first contact hole 330a, and can be optionally performed.

Referring to FIG. 7D, an insulating layer 120 is formed on the entire surface of the resulting structure where the first contact hole 330a is formed.

Although not shown, an oxide layer for silicide protection can be defined in the active region (FD region) prior to the process of forming the insluting layer 120 and then silicidation can be performed.

Referring to FIG. 7E, the first contact hole 330a is exposed by removing a portion of the insulating layer 120 corresponding to the first contact hole 330a, and a second contact hole 340b is formed on the first contact hole 330a. It is preferable that a diameter (d2) of the second contact hole 340b be greater than or equal to a diameter (d1) of the first contact hole 340a. If the diameter (d2) of the second contact hole 340b is less than the diameter (d1) of the first contact hole 330a, the lower portion of the second contact hole 340b is located within the first contact hole 330a. Therefore, even if a buried contact is formed by filling the second contact hole 340b with metal, the FD region and the gate electrode 220 of the third gate 200c are not electrically connected by the insulating layer 120 remaining at the sidewall of the first contact hole 330a.

In addition, it is preferable that the first contact hole 330a and the second contact hole 340b be wholly or partially overlapped with each other. Specifically, when the first contact hole 330a and the second contact hole 340b are partially overlapped with each other, it is preferable that they be overlapped in a moving direction of electrons so that the electrons can move smoothly.

Then, as illustrated in FIG. 5, the first contact hole 330a and the second contact hole 340b are filled with metal to form a buried contact 300. That is, the buried contact 300 has a stacked structure of the first contact 330 and the second contact 340. The FD region and the gate electrode 220 of the third gate 200c are directly connected through the buried contact 300. Therefore, an area of the contact for connecting the third gate 200c to the FD region can be minimized and thus the CMOS image sensor can be highly integrated.

According to the present invention, the CMOS logic circuit part for connecting the third gate to the FD region can be minimized in the entire area of the image sensor. Consequently, the photosensitivity can be improved by increasing the area ratio of the PD in the entire area of the image sensor.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A CMOS image sensor comprising:
   a device isolation layer formed in a substrate to define an active region;
   a photodiode formed in the active region;
   a floating diffusion region formed at a position spaced apart from the photodiode;
   a first gate formed between the photodiode and the floating diffusion region;
   a second gate formed at a side of the floating diffusion region;
   a third gate disposed between the first gate and the second gate and overlapped with an upper portion of the device isolation layer and a predetermined portion of the floating diffusion region;
   an insulating layer formed on a resulting structure where the third gate is formed; and
   a buried contact having a first contact and a second contact, the first contact and the second contact being sequentially stacked to pass through the insulating layer and the third gate and to connect the third gate to the floating diffusion region disposed under the third gate.

2. The CMOS image sensor according to claim 1, wherein the first gate is a transfer gate, the second gate is a reset gate, and the third gate is a drive gate.

3. The CMOS imager sensor according to claim 2, wherein each of the first gate, the second gate, and the third gate has a stacked structure of a gate dielectric layer and a gate electrode, the gate electrode having a multi-layer structure in which a polysilicon layer and a metal layer are sequentially stacked.

4. The CMOS image sensor according to claim 1, wherein the first gate, the second gate, and the third gate have spacers on sidewalls thereof.

5. The CMOS image sensor according to claim 1, wherein a diameter of the second contact is greater than or equal to that of the first contact.

6. The CMOS image sensor according to claim 1, wherein the buried contact is formed by wholly or partially overlapping the first contact with the second contact.

7. The CMOS image sensor according to claim 6, wherein when the first contact and the second contact are partially overlapped with each other, the first contact and the second contact are overlapped in a moving direction of electrons.

8. The CMOS image sensor according to claim 1, wherein the substrate is formed using a semiconductor layer, the semiconductor layer being formed by stacking a highly doped P++ layer and a P-epi layer in sequence.

* * * * *